United States Patent [19]

Zimmerman, Jr. et al.

[11] 4,155,615

[45] May 22, 1979

[54] MULTI-CONTACT CONNECTOR FOR CERAMIC SUBSTRATE PACKAGES AND THE LIKE

[75] Inventors: John A. Zimmerman, Jr., Hershey; Clarence L. Paullus, Lewisberry, both of Pa.

[73] Assignee: AMP Incorporated, Harrisburg, Pa.

[21] Appl. No.: 871,867

[22] Filed: Jan. 24, 1978

[51] Int. Cl.² .......................................... H01R 3/06
[52] U.S. Cl. ................................. 339/14 L; 29/629; 174/52 FP; 339/17 CF
[58] Field of Search ............... 339/14 L, 14 P, 14 T, 339/14 R, 17 CF, 17 M, 17 LM, 59 M, 174, 176 M, 176 MP, 206 R, 256 S, 275 B; 174/52 FB; 29/629

[56] References Cited

U.S. PATENT DOCUMENTS

| | | | |
|---|---|---|---|
| 3,597,839 | 8/1971 | Jaccodire | 339/17 CF X |
| 3,753,211 | 8/1973 | Pauza et al. | 339/75 MP |
| 3,877,064 | 4/1975 | Scheingold et al. | 339/17 CF |
| 3,910,664 | 10/1975 | Pauza et al. | 339/17 CF |
| 4,018,494 | 4/1977 | Scheingold et al. | 339/17 CF |
| 4,028,794 | 6/1977 | Ritchie et al. | 29/629 |
| 4,045,105 | 8/1977 | Lee et al. | 339/17 CF |
| 4,052,118 | 10/1977 | Scheingold et al. | 339/17 CF |
| 4,094,564 | 6/1978 | Cacolici | 339/14 L |

*Primary Examiner*—Roy Lake
*Assistant Examiner*—DeWalden W. Jones
*Attorney, Agent, or Firm*—Russell J. Egan

[57] ABSTRACT

A multi-contact electrical connector is disclosed for connecting a plurality of terminal pads on an integrated circuit ceramic substrate package to a like plurality of terminal pads on a printed circuit board. The subject multi-contact electrical connector includes at least two continuous strips of contacts, each formed by a plurality of parallel spaced contact members secured between two webs of flexible insulation material and folded upon themselves. One end of each contact is secured to a pad of a printed circuit board so that the strips are free standing extending normal to the plane of the board and define the periphery of the integrated circuit ceramic substrate package received therebetween. The free ends of the contacts resiliently engage the package pads. A profiled open housing is provided to surround the upper free end of the contacts and provide a resilient backing for them.

6 Claims, 2 Drawing Figures

MULTI-CONTACT CONNECTOR FOR CERAMIC SUBSTRATE PACKAGES AND THE LIKE

BACKGROUND OF THE INVENTION

1. The Field of the Invention

The present invention relates to a multi-contact electrical connector and in particular a connector for use in connecting ceramic substrate packages to other circuitry, for example, a printed circuit board.

2. The Prior Art

Integrated circuit devices are commonly mounted on relatively thin ceramic plates, commonly referred to as substrates, which have conductors therein extending from the integrated circuit device or "chip" to the marginal portions of at least one face of the substrate. Enlarged contact areas or contact pads are formed at the ends of the substrate conductors on one of the faces of the substrate for connecting the substrate conductors to external conductors. The substrate conductors are commonly connected to external conductors by multi-contact electrical connectors and a variety of types of connectors have been developed for use with the previously known designs of ceramic substrates.

Some of these integrated circuit devices have their contacts extending beyond the surface of the ceramic substrate and form what has been known as a DIP package and is used in combination with a DIP header. An example of such a connector is found in U.S. Pat. No. 3,525,972.

More recently, and for reasons dictated by substrate manufacturing considerations and other reasons, substrates have been introduced which have their contact pad portions located on their sides rather than on their faces. Presently known connectors which were designed for substrates having the type terminal pads on their faces cannot be used with these newly developed types of substrates and cannot be adopted for use with side contact substrates. Examples of known substrate connectors may be found in U.S. Pat. Nos. 3,753,211; 3,754,203; 3,877,064; 3,910,664; 3,940,786; 3,960,423; 4,018,494; and 4,052,118.

SUMMARY OF THE INVENTION

The present invention concerns a multi-contact connector for ceramic substrate packages formed by a plurality of connector members and a housing frame member. Each connector member is formed by a plurality of individual contacts held in parallel spaced relation by being bonded between two webs of insulative material. A strip of contacts and insulative webs is formed in a ladder like configuration and then bent upon itself about the longitudinal axis of the strip so that each contact forms a substantially 180° loop with at least one free end of the contacts being bent normal to the plane of the strip. This end of each contact is secured to the pads of a printed circuit board or the like by conventional means, such as soldering. Thus the strips form a continuous series of free standing contacts surrounding and defining an area to receive the integrated circuit ceramic package therein. A hollow housing frame is placed about the upper or bent ends of the contacts and provides a reaction surface for the conacts as the integrated circuit package is inserted into the connector.

It is therefore an object of the present invention to produce an improved integrated circuit ceramic package connector which can form interconnections on extremely close center lines.

It is another object of the present invention to produce an improved multi-contact connector for integrated circuit ceramic packages which provides a controlled impedance in the connector assembly.

It is still another object of the present invention to produce an improved multi-contact connector system which can accommodate a wide range of ceramic package sizes and configurations without any major modifications to the connector.

It is a further object of the present invention to produce an improved multi-contact connector for making integrated circuit ceramic substrate package to printed circuit board connections which connector can be readily and economically manufactured.

The means for accomplishing the foregoing objects and other advantages of the present invention will become apparent to those skilled in the art from the following detailed description taken with reference to the accompanying drawings.

DETAILED DESCRIPTION OF THE PREFERRED EMBODIMENT

Figure 1:
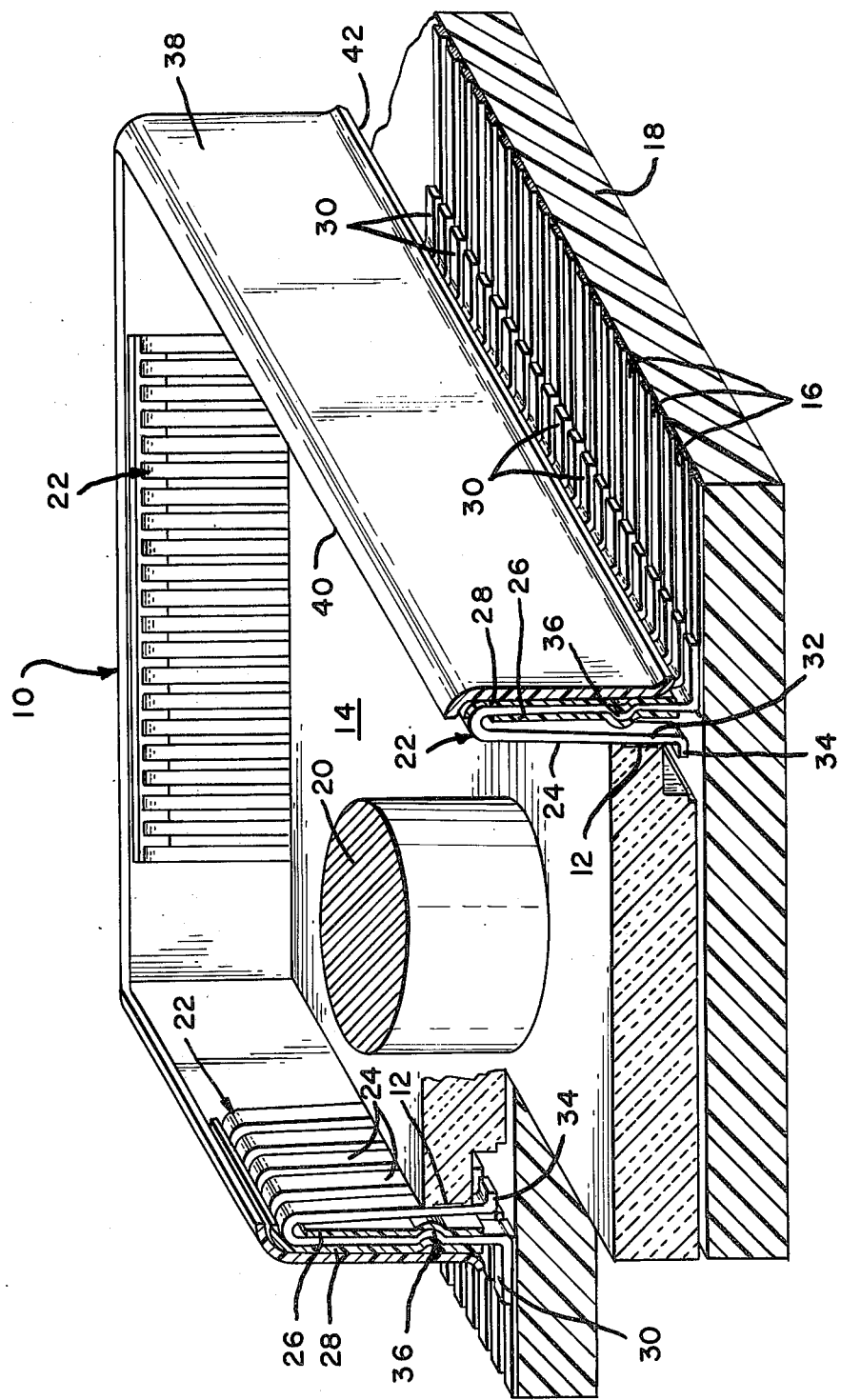
FIG. 1 is a perspective view, partially in section, of the subject multi-contact connector mounted on a printed circuit board and receiving an integrated circuit ceramic substrate package therein.
Figure 2:
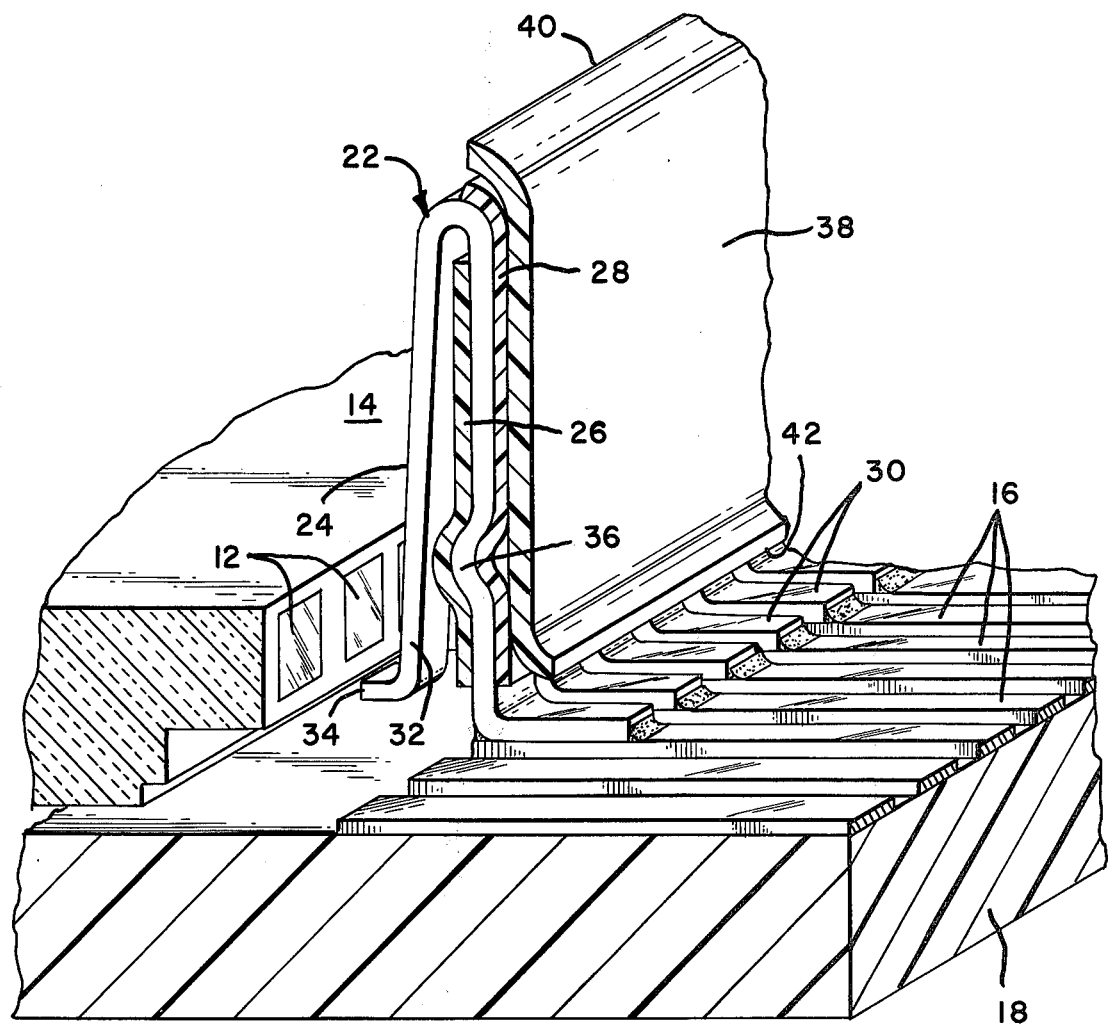
FIG. 2 is an enlarged perspective view, partially in section, of a portion of the subject multi-contact connector showing the details thereof.

The connector 10 of the present invention serves the function of connecting terminal pads 12 of an integrated circuit ceramic substrate package 14 to respective external conductors 16 formed on one side of a printed circuit board 18. The ceramic substrate package 14 comprises a generally rectangular ceramic body having parallel faces on the sides and ends with a plurality of pads 12 opening on each of the faces. The pads have conductors attached thereto leading through the ceramic to an integrated circuit device (not shown). A heat sink 20 is bonded to the package 14 to serve both as a heat sink for the integrated circuit device and as a convenient handle for insertion and extraction of the package 14 into and out of the subject connector 10.

The connector 10 itself is formed by a plurality of connector members 22. The members 22 are arranged in parallel spaced pairs and secured to the printed circuit board 18 in an alignment defining therebetween the configuration of the package 14.

Each of the multiple contact connector members 22 has a plurality of elongated contact members 24 held in parallel spaced relation between webs 26, 28 of insulative material which are bonded thereto. The contacts 24 are folded upon themselves and profiled to have a foot portion 30 adapted to be attached to the respective pads 16 of the printed circuit board 18, a free end portion 32 for contacting the pads 12 of the device 14, and a lip 34 which serves to provide clearance between the free end 32 of the contacts and the printed circuit board 18. A bump 36 is formed in one upstanding portion of each contact and serves as an overstress arrangement to prevent damage to the connector members which might be caused by undue shifting of the package 14. A hollow rectangular shell or metal housing 38 completes the multi-contact connector. The metal shell 38 has a slightly inwardly directed upper flange 40, which prevents the shell from being forced too far down onto the connector member 22. The shell also includes a lower flange 42 which is outwardly directed to prevent unintentional shorting between the shell 38 and either the contacts 24 or the conductors 16. The web of insulation 28 prevents shorting between the shell 38 and the contacts 24.

The subject connector members preferably are made by a process of roll forming, such as that described in U.S. Pat. No. 4,028,794, the disclosure of which is incorporated herein by reference.

The contacts preferably are held between layers of insulative materials such as Mylar, paper, and other known insulative material. The Mylar can be on a thickness of anywhere from 1 to 7 mils and a suitable binding agent for laminating the Mylar to the contacts was found to be EI Dupont Nos. 49,000 or 49,002 adhesives. Also Kapton or Nomax plastic sheet material may be bonded with EI Dupont No. A adhesive. The contacts themselves can be relatively thick for example, 0.007 and should be a metal having good spring characteristics such as phosphor bronze or berylium copper. The contacts themselves can be placed on extremely close center lines and it is possible to form a ladder of the contacts either by etching or stamping a series of contacts from a continuous web of metal stock and subsequently laminate the layers of insulation 26, 28 thereon prior to forming into the final configuration. The contacts 24 can also be very narrow in width and placed on extremely close center lines without detracting from the operational characteristics of the subject invention.

At higher frequencies, it is essential to match the impedance of the source and load. It is possible to provide a controlled impedance in the subject connector assembly. By proper selection of the insulative material and its thickness, it is possible to control the capacitance between the contacts and the housing shell thereby establishing an inherent impedance to the system when the housing is grounded.

The present invention may be subject to many modifications and changes without departing from the spirit or essential characteristics thereof. The present invention is to be considered in all respects as being illustrative and not restrictive of the scope of the invention.

What is claimed is:

1. A multi-contact electrical connector for connecting terminal pads of a ceramic substrate package to corresponding terminal pads on a printed circuit board, said connector comprising:

at least two terminal strip members, each said strip member having a plurality of terminals of resilient spring metal and two webs of insulating material, said terminals extending in spaced, parallel side-by-side relationship bonded between said webs of insulation material, said terminals being reversibly formed with respect to the axis of said strip members through an angle of substantially 180° intermediate the ends thereof forming two legs, each of said terminals constituting a resilient contact spring, the ends of the legs of each of said terminals being exposed from said insulation webs and forming first and second contact zones adapted for engagement with said ceramic substrate and said printed circuit, respectively, said contact terminal strip members being mounted on a printed circuit board extending normal to the plane thereof and defining therebetween a configuration for receiving therein a ceramic substrate package, and a hollow metal housing shell of like configuration received about the outside of said members and serving as a reaction surface for said members when said ceramic substrate is received therein, whereby upon mounting said members on the printed circuit board in parallel oppositely directed rows the terminal pads of the package engage the free ends of the terminals with sufficient force being generated therebetween to form an effective electrical connection.

2. A multi-contact electrical connector according to claim 1 further comprising:

a bump formed on one said leg of each said terminal directed toward the other leg and serving as overstress compensation.

3. An electrical connector in combination with a printed circuit board for electrically connecting a ceramic substrate package thereto, said connector comprising:

at least two terminal strip members each having a plurality of parallel spaced relilient spring terminals bonded between webs of flexible insulative material covering at least a intermediate portion of both sides of each of said terminals, said terminals being reversibly formed with respect to the axis of said terminal strip member through an angle of substantial 180° intermediate the ends thereof, one free end of each said spring terminal being bent substantially normal to the axis of said terminal strip member and secured to a respective pad of said printed circuit board so that said terminal strip member is substantially upwardly free standing from said circuit board, said terminal strip members being secured to said circuit board defining therebetween the profile of a ceramic substrate package to be engaged thereby, and a hollow metal housing shell loosely received over the upper free ends of said terminal strip members and serving as a reactive surface for said spring terminals and being insulated therefrom by one of said layers of insulation.

4. An electrical connector according to claim 3 further comprising:

means grounding said shell to said printed circuit board whereby loss of signals at high frequency is reduced by matching the impedance of the source and the load.

5. An electrical connector according to claim 3 further comprising:

a bump formed on one folded portion of each said terminal directed towards the adjacent folded portion and serving for overstress compensation.

6. A multi-contact electrical connector for connecting terminal pads of a ceramic substrate package to terminal pads of a printed circuit board, said connector comprising:

at least one pair of terminal strip members, each said strip member having a plurality of terminals of resilient spring metal bonded between bonded between two webs of insulating material, said terminals extending in spaced parallel side-by-side relationship with the ends thereof exposed forming first and second contact zones adapted to engage said package and said board, respectively, said terminals being reversibly formed upon themselves with respect to the axis of said strip through an angle of substantially 180° intermediate the ends of the terminals, said second contact zones being bent substantially normal to the plane of said members and secured to a printed circuit board extending normal to the plane thereof and defining a configuration for receiving the ceramic substrate package, and a hollow housing shell received about the upper outer ends of said members and serving as a reaction surface for said members when said ceramic substrate is received therein, whereby upon mounting said members on the printed circuit board in parallel oppositely directed rows the terminal pads of said package engage the free ends of the contacts with sufficient force being generated to form an effective electrical connection therebetween.

* * * * *